(12) United States Patent
Naito et al.

(10) Patent No.: US 6,333,269 B2
(45) Date of Patent: *Dec. 25, 2001

(54) PLASMA TREATMENT SYSTEM AND METHOD

(75) Inventors: Yoko Naito, Sagamihara; Hideaki Amano, Zama, both of (JP)

(73) Assignee: Tokyo Electron Limited, Tokyo-To (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/153,141

(22) Filed: Sep. 14, 1998

(30) Foreign Application Priority Data

Sep. 16, 1997 (JP) ...................................... 9-270454
Sep. 11, 1998 (JP) .................................... 10-276476

(51) Int. Cl.⁷ ................................................ H01L 21/3065

(52) U.S. Cl. .......................... 438/706; 438/710; 438/726; 438/728

(58) Field of Search ................................... 438/706, 710, 438/726, 728, 732, 734, 743

(56) References Cited

U.S. PATENT DOCUMENTS

| | | | |
|---|---|---|---|
| 5,245,157 | * 9/1993 | Ohiwa | 219/121.43 |
| 5,425,843 | * 6/1995 | Saul et al. | 438/694 |
| 5,616,423 | 4/1997 | Sanjyou et al. | 428/632 |
| 5,620,522 | * 4/1997 | Ichimura et al. | 118/723 MR |
| 5,868,854 | * 2/1999 | Kojuma et al. | 134/1.3 |
| 5,915,190 | * 6/1999 | Pirkle | 438/424 |
| 5,925,265 | * 7/1999 | Watanabe et al. | 219/121.43 |

FOREIGN PATENT DOCUMENTS 05315097   11/1993  (JP).
5-315097   11/1993  (JP).

OTHER PUBLICATIONS

Tipler, Paul A, Physics 2nd ed, Worth Publishiers Inc., p. 722–723 and 751–753, 1982.*

* cited by examiner

Primary Examiner—Felisa Hiteshew
Assistant Examiner—Binh X. Tran
(74) Attorney, Agent, or Firm—Smith, Gambrell & Russell, LLP (57) ABSTRACT

It is an object to enhance the degree of freedom for the shape of an obtained magnetic field to enhance the inplane uniformity of thickness of first and second films when the first and second films are continuously formed on a substrate to be treated. A main electromagnetic coil 5 is provided outside of a plasma chamber 21 so as to be movable vertically by a lifting shaft 52. When plasma is produced in a vacuum vessel 2 by the electron cyclotron resonance between a microwave and a magnetic field to continuously deposit a film of a two-layer structure, which comprises an SiOF film and an $SiO_2$ film, on a wafer W with the produced plasma, a process for forming the SiOF film is carried out while the main electromagnetic coil 5 is arranged so that the lower surface of the coil 5 is positioned at a lower position than the lower surface of a transmission window 23 by 139 mm, and a process for forming the $SiO_2$ film is carried out while the main electromagnetic coil 5 is arranged so that the lower surface of the coil 5 is positioned at a lower position than the lower surface of the transmission 23 by 157 mm.

2 Claims, 11 Drawing Sheets

PLASMA TREATMENT SYSTEM AND METHOD

BACKGROUND OF THE INVENTION

1. Field of the Invention

The present invention relates generally to a plasma treatment system and method for depositing a thin film, such as SiOF and $SiO_2$ films, on a substrate to be treated, such as a semiconductor wafer, by a plasma treatment, such as an ECR (Electron Cyclotron Resonance) treatment.

2. Related Background Art

Figure 11:
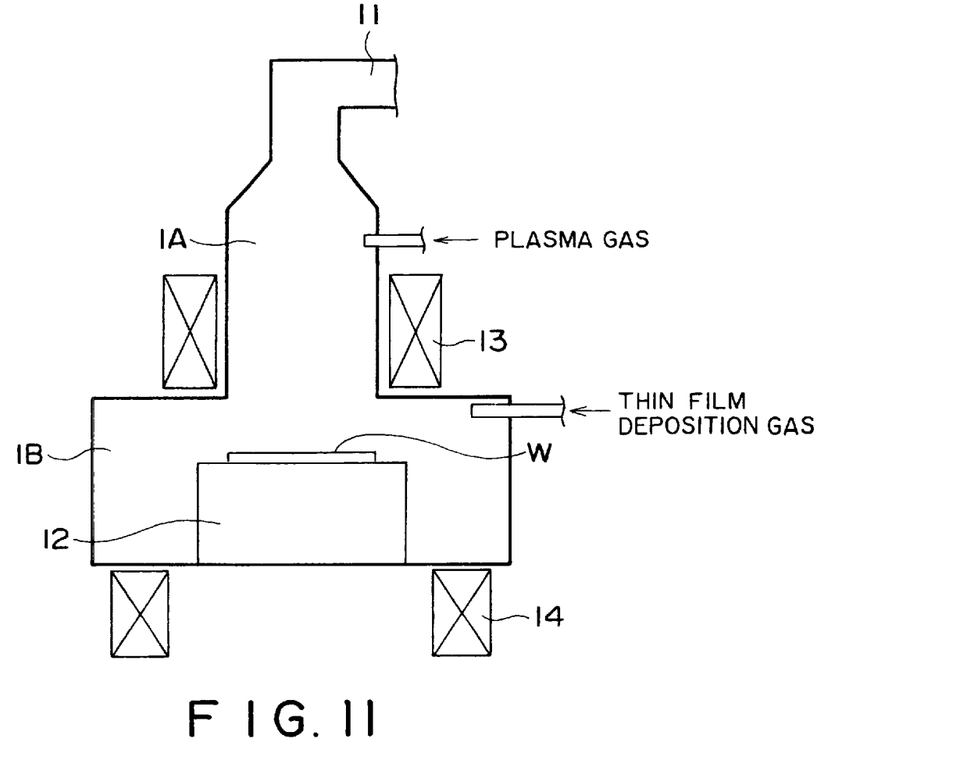
FIG. 11 is a sectional view of a conventional plasma treatment system.

An aluminum wiring is typically used as a wiring pattern for an integrated circuit. An $SiO_2$ film, an SiOF film or the like is typically used as an interlayer insulator film for insulating the aluminum wiring. These films are formed by means of, e.g., a plasma treatment system for carrying out the ECR plasma treatment as shown in FIG. 11.

For example, in this system, a microwave of, e.g., 2.45 GHZ, is supplied to a plasma producing chamber 1A by means of a waveguide 11, and a magnetic field of, e.g., 875 gausses, is applied thereto, so that the interaction (the Electron Cyclotron Resonance) between the microwave and the magnetic field activates a plasma gas, such as Ar or $O_2$ gas, and a thin film deposition gas, such as $SiH_4$ gas, which is introduced into a thin film deposition chamber 1B, to produce plasma serving as active species to deposit a thin film on a semiconductor wafer (which will be hereinafter referred to as a "wafer") W mounted on a mounting table 12.

The magnetic field is applied as a downward magnetic field, which extends from the plasma chamber 1B to the thin film deposition chamber 1B, by the combination of a main electromagnetic coil 13, which is provided so as to surround the plasma chamber 1A, and an auxiliary electromagnetic coil 14, which is provided below the thin film deposition chamber 1B.

By the way, the above described plasma treatment system is designed to adjust the shape of the magnetic field by changing the currents flowing through the main electromagnetic coil 13 and the auxiliary electromagnetic coil 14 since the main electromagnetic coil 13 and the auxiliary electromagnetic coil 14 are fixed to the aforementioned positions. However, in a case where only such adjustment of coil current is carried out, when only the current of one of the electromagnetic coils is adjusted, the shape of the magnetic field itself is not changed although the intensity of the magnetic force on the magnetic potential surface of the magnetic field applied by the adjusted electromagnetic coil is changed.

Figure 12:
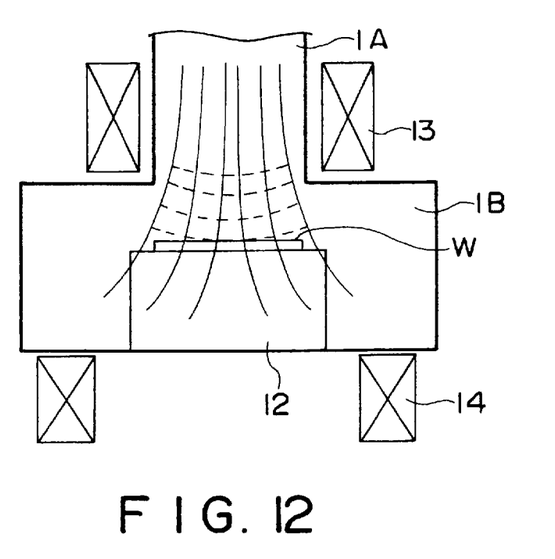
FIG. 12 is an explanatory drawing showing a divergent field applied to a conventional plasma treatment system.

For example, a divergent field shown in FIG. 12 can be obtained by causing the current flowing through the auxiliary electromagnetic coil 14 to be far smaller than the current flowing through the main electromagnetic coil 13 or to be zero. However, if only the current flowing through the main electromagnetic coil 13 is increased without changing the current flowing through the auxiliary electromagnetic coil 14, only the intensity of the magnetic force on the magnetic potential surface shown by the dotted lines in FIG. 12 is increased.

Figure 13A:
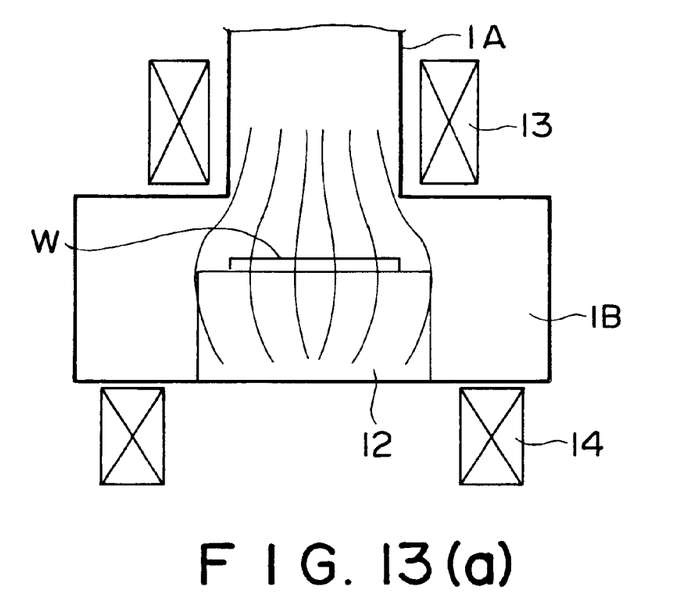
FIGS. 13(a) and 13(b) are explanatory drawings showing mirror and cusp fields applied to a conventional plasma treatment system.
Figure 13B:
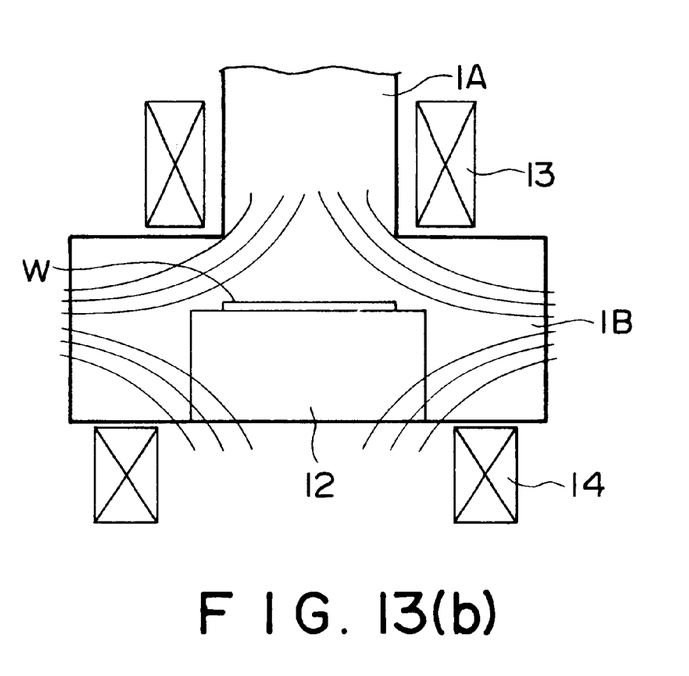

In addition, when the respective currents of the main electromagnetic coil 13 and the auxiliary electromagnetic coil 14 are adjusted, the shape of the magnetic field is greatly changed. For example, when the current flowing through the auxiliary electromagnetic coil 14 is higher than that in the case of the divergent field, a mirror field shown in FIG. 13(a) is formed, and when the direction of the current flowing through the auxiliary electromagnetic coil 14 is inverted, a cusp field shown in FIG. 13(b) is formed. As described above, the shape of the applied magnetic field changed by only the adjustment of currents flowing through the electromagnetic coils is restricted, and the degree of freedom for the shape of the obtained magnetic field is small.

By the way, in recent years, a thin film of a two-layer structure obtained by stacking an SiOF film and an $SiO_2$ film is provided in order to obtain a high quality interlayer insulator film. Such a film is continuously formed in, e.g., the above described plasma treatment system. However, the conditions in the processes for depositing these films are different from each other. If the shape of the magnetic field is optimized for one of the films, the inplane uniformity of thickness of the other film is deteriorated.

Therefore, it is required to adjust the shape of the magnetic field so as to enhance the inplane uniformity of thickness of both films. However, as described above, the degree of freedom for the shape of the magnetic field is small in the present circumstances, so that it is very difficult to adjust the shape of the magnetic field. In recent years, the scale down of devices is accelerated, so that it is required to provide thinner interlayer insulator films. Therefore, it is conceived that it is more difficult to adjust the shape of the magnetic field.

SUMMARY OF THE INVENTION

It is therefore an object of the present invention to eliminate the aforementioned problems and to provide a plasma treatment system which can enhance the degree of freedom for the shape of an obtained magnetic field by providing a movable magnetic field forming means.

It is another object of the present invention to provide a plasma treatment method which can enhance the inplane uniformity of thickness of first and second films when the first and second films are continuously deposited on a substrate to be treated.

In order to accomplish the aforementioned and other objects, according to one aspect of the present invention, there is provided a plasma treatment system for producing plasma in a vacuum vessel by the electron cyclotron resonance between a microwave and a magnetic field to treat a substrate to be treated, with the produced plasma, wherein magnetic field forming means for forming a magnetic field in the vacuum vessel is provided so as to be movable in a direction perpendicular to the substrate, and the shape of the magnetic field formed in the vacuum vessel is adjusted by moving the magnetic field forming means in the direction.

The magnetic field forming means may comprise first magnetic field forming means provided around a central axis of the substrate so as to surround a region facing a surface to be treated of the substrate, and second magnetic field forming means provided around the central axis so as to surround a region below at least the substrate, at least one of the first and second magnetic field forming means being provided so as to be movable in a direction perpendicular to the substrate. In this case, the magnetic field forming means may be an electromagnetic coil.

According to another aspect of the present invention, there is provided a plasma treatment method for activating a thin film deposition gas to produce plasma in a vacuum vessel by the electron cyclotron resonance between a microwave and a magnetic field to sequentially deposit first and second films on a substrate to be treated, the plasma treatment method comprising the steps of: arranging magnetic forming means for forming a magnetic field in the vacuum vessel, at a first position to activate a first thin film deposition gas to produce plasma to form a first film on a surface to be treated of the substrate; and arranging the magnetic field forming means at a second position to activate a second thin film deposition gas to produce plasma to form a second film on the surface of the first film formed on the substrate.

According to another aspect of the present invention, there is provided a plasma treatment method for supplying a microwave into a vacuum vessel by high-frequency producing means and for forming a magnetic field into the vacuum vessel by magnetic field forming means, to produce plasma in the vacuum vessel by the electron cyclotron resonance between the microwave and the magnetic field to treat a substrate to be treated, with the produced plasma, the plasma treatment method comprising: a first step of introducing the substrate into the vacuum vessel and producing plasma to heat the substrate; and a second step of activating a thin film deposition gas to produce plasma in the vacuum vessel to form a thin film on the substrate with the produced plasma, wherein the position of the magnetic field forming means is changed between positions in the first and second steps to change the shape of the magnetic field so that a magnetic flux density on the substrate when plasma is produced in the first step is greater than that in the second step.

According to a further aspect of the present invention, there is provided a plasma treatment method for supplying a microwave into a vacuum vessel by high-frequency producing means and for forming a magnetic field in the vacuum vessel by magnetic field forming means, to produce plasma in the vacuum vessel by the electron cyclotron resonance between the microwave and the magnetic field to treat a substrate to be treated, with the produced plasma, the plasma treatment method comprising: an etching step of activating an etching gas to produce plasma in the vacuum vessel to etch the substrate with the plasma; and a post-treatment step of activating a post-treatment gas to produce plasma in the vacuum vessel to carry out a post-treatment with the plasma, wherein the position of the magnetic field forming means is changed between positions in the etching and post-treatment steps to change the shape of the magnetic field so that a magnetic flux density on the substrate when plasma is produced in the post-treatment step is greater than that in the etching step. This post-treatment includes a treatment for removing the residual of the etching gas, and a treatment for ashing the resist film with oxygen gas.

According to a still further aspect of the present invention, there is provided a plasma treatment method for supplying a microwave into a vacuum vessel by high-frequency producing means and for forming a magnetic field in the vacuum vessel by magnetic field forming means, to produce plasma in the vacuum vessel by the electron cyclotron resonance between the microwave and the magnetic field to treat a substrate to be treated, with the produced plasma, the plasma treatment method comprising: an etching step of activating an etching gas to produce plasma in the vacuum vessel to etch a natural oxide film on the surface of the substrate with the plasma; and a thin film deposition step of activating a thin film deposition gas to produce plasma in the vacuum vessel to form a thin film on the surface of the substrate with the plasma, wherein the position of the magnetic field forming means is changed between positions in the etching and thin film deposition steps to change the shape of the magnetic field so that a magnetic flux density on the substrate when plasma is produced in the etching step is greater than that in the thin film deposition.

According to the present invention, since the magnetic field forming means is movable, the degree of freedom for the shape of the obtained magnetic field is enhanced. In addition, according to the present invention, when the first and second films are continuously deposited on the substrate to be treated, the shape of the magnetic field can be selected so as to enhance the inplane uniformity of thickness of the first film, and the shape of the magnetic field can be selected so as to enhance the inplane uniformity of thickness of the second film. As a result, the inplane uniformity of thickness of each of the first and second films continuously deposited can be enhanced.

Moreover, according to the present invention, since the magnetic field forming means is movable, the degree of freedom for the shape of the magnetic field is enhanced, and a plasma treatment suitable for each of two steps can be carried out by changing the profile of the magnetic field.

For example, during the preheat, the quantity of energy input into the wafer W is regarded as more important than the uniformity to form a magnetic field so as to increase the quantity of energy input, and during the thin film deposition, the uniformity is regarded as more important than the quantity of energy input to form a magnetic field having a high inplane uniformity. The shape of the magnetic field is changed by changing the position of the magnetic field forming means between a position during the preheat and a position during the thin film deposition or by changing the current flowing through the electromagnetic coil of the magnetic field forming means, so that plasma suitable for the respective treatments can be produced to reduce the preheat time.

For example, between the etching step of etching the substrate to be treated and the post-treatment step or between the etching step of etching the natural oxide film and the thin film deposition step, the position of the magnetic field forming means is changed to change the shape of the magnetic field, so that plasma suitable for the respective treatments can be produced.

DESCRIPTION OF THE PREFERRED EMBODIMENTS

Figure 1:
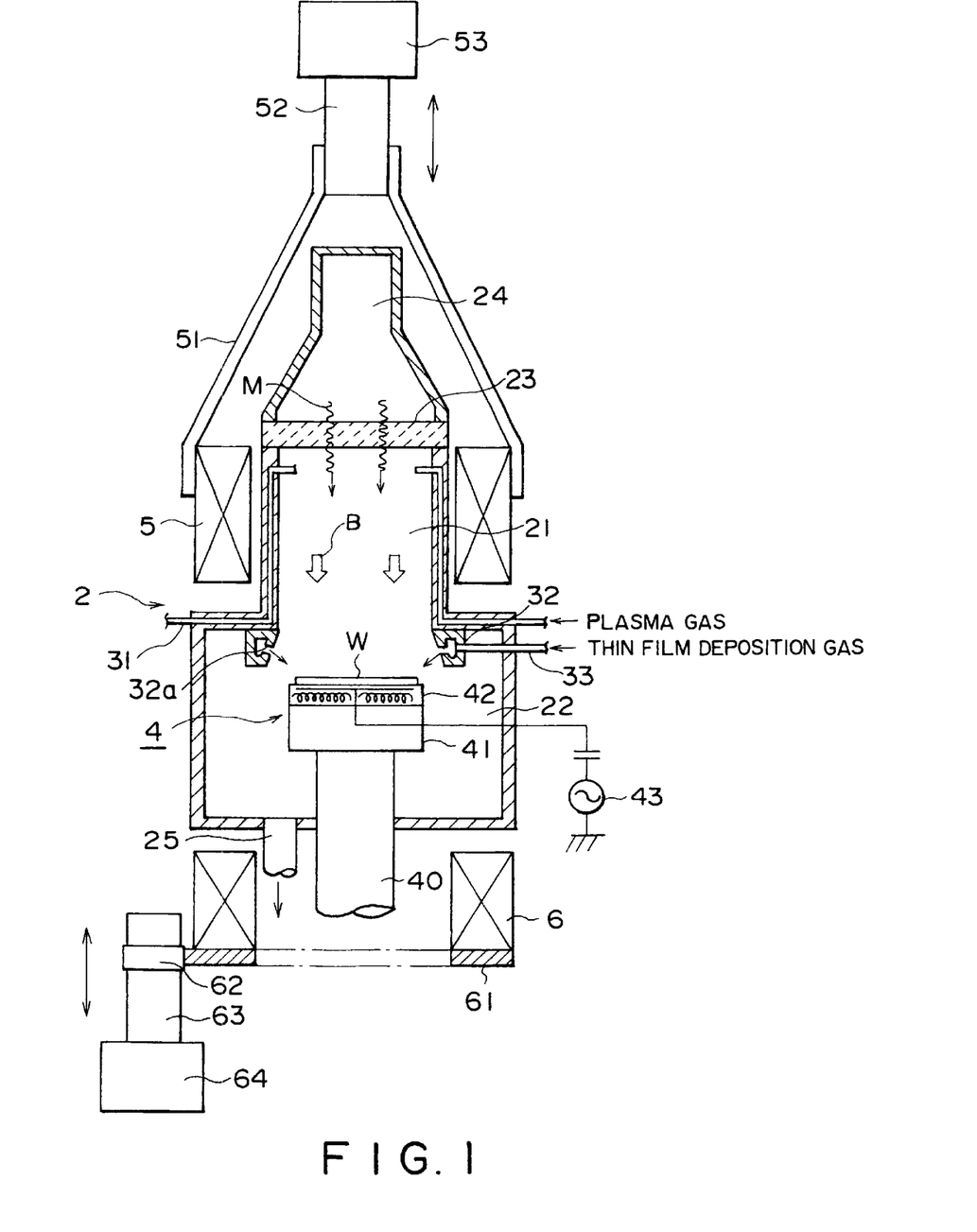
FIG. 1 is a sectional view of a preferred embodiment of a plasma treatment system according to the present invention.

FIG. 1 is a sectional view of a preferred embodiment of a plasma treatment system according to the present invention. In this figure, 2 denotes a vacuum vessel of, e.g., aluminum. The vacuum vessel 2 comprises a plasma chamber 21 for producing plasma, and a thin film deposition chamber 22 provided below the plasma chamber 21 to be communicated therewith. The vacuum vessel 2 is grounded to have a zero potential.

A transmission window 23 of a microwave permeable material is airtightly provided on the upper end portion of the vacuum vessel 2 for maintaining the vacuum in the vacuum vessel 2. Outside of the transmission window 23, a waveguide 24 connected to a high-frequency power supply (not shown) serving as a plasma producing high-frequency supply means is provided. A microwave of, e.g., 2.45 GHz, produced by the high-frequency power supply can be guided by the waveguide 24 to be introduced from the transmission window 23 into the plasma chamber 21.

On the upper side of the side wall defining the plasma chamber 21, gas nozzles 31 for supplying, e.g., a thin film deposition gas, are arranged at regular intervals in the circumferential directions thereof. The gas nozzles 31 are connected to a plasma gas source (not shown) so as to be able to uniformly supply plasma gases, such as Ar and $O_2$ gases, to the upper portion in the plasma chamber 21. Furthermore, although only two nozzles 31 are shown in the drawing to simplify the drawing, two or more nozzles 31 are provided in fact.

A ring-shaped thin film deposition gas supply portion 32 is provided in the upper portion of the thin film deposition chamber 22, i.e., in a portion communicating with the plasma chamber 21. The thin film deposition gas supply portion 32 is formed with a gas supply port 32a in the inner periphery surface thereof. The thin film deposition gas supply portion 32 is connected to one end of a gas supply pipe 33, the other end of which is a thin film deposition gas source (not shown). Thus, thin film deposition gases, such as $SiH_4$ and $SiF_4$, are jetted from the gas supply port 32a into the thin film deposition chamber 22.

In the thin film deposition chamber 22, a mounting table 4 for holding the wafer W is provided on the upper portion of a cylindrical supporting member 40. The supporting member 40 passes through the bottom wall of the vacuum vessel 2. The supporting member 40 is movable vertically with respect to the vacuum vessel 2 while maintaining the airtightness of the vacuum vessel 2. The mounting table 4 comprises a mounting table body 41, and a dielectric plate 42 with a built-in heater and a built-in electrode. The mounting surface serves as an electrostatic chuck. The electrode is connected to a DC power supply (not shown) for the electrostatic chuck and to a high-frequency power supply 43 for applying a bias voltage for drawing ions into the wafer W. An exhaust pipe 25 is connected to the bottom of the thin film deposition chamber 22.

In vicinity of the outer periphery of the side wall defining the plasma chamber 21, a ring-shaped main electromagnetic coil 5 serving as a first magnetic field forming means is arranged so as to surround the plasma chamber 21. Below the thin film deposition chamber 22, a ring-shaped auxiliary electromagnetic coil 6 serving as a second magnetic field forming means is arranged. These coils 5 and 6 are designed to form a magnetic field B of, e.g., 875 gausses, which extends downward across the thin film deposition chamber 22. For example, the main electromagnetic coil 5 has an inside diameter of 350 mm, an outside diameter of 486 mm and a height of 276 mm, and the auxiliary electromagnetic coil 6 has an inside diameter of 505 mm, an outside diameter of 605 mm and a height of 120 mm.

One end side of a plate supporting member 51 is mounted on the upper side of the outer periphery of the main electromagnetic coil 5 at, e.g., two positions. The other end side of the supporting member 51 is mounted on the outer periphery of a lifting shaft 52 arranged above the waveguide 24. The main electromagnetic coil 5 is suspended from the supporting member 51. On the other hand, the auxiliary electromagnetic coil 6 is provided on a ring-shaped horizontal supporting plate 61. A part of the supporting plate 61 is mounted on a lifting shaft 63 by means of a mounting member 62.

The lifting shafts 52 and 63 are movable vertically by means of actuators, respectively. Thus, the main electromagnetic coil 5 is designed to move vertically with respect to the plasma chamber 21 by the vertical movement of the lifting shaft 52, and the auxiliary electromagnetic coil 6 is designed to move vertically with respect to the thin film deposition chamber 22 by the vertical movement of the lifting shaft 63. For example, the waveguide 24 is formed by connecting one end of a horizontal rectangular waveguide to the upper side of a conical waveguide. In this case, the rectangular waveguide is arranged so as not to interfere with the supporting member 51.

A method for depositing a film of a two-layer structure (which will be hereinafter referred to as a "two-layer film"), which comprises an SiOF film serving as a first film and an $SiO_2$ film serving as a second film, on a wafer W serving as a substrate to be treated, by means of the above described plasma treatment system will be described below. First, referring to FIG. 2, this two-layer film will be briefly described. This film comprises an interlayer insulator film 71 of an SiOF film, and a cap film 72 of an $SiO_2$ film formed on the surface thereof. Such structure enhances thermal stability.

Figure 2:
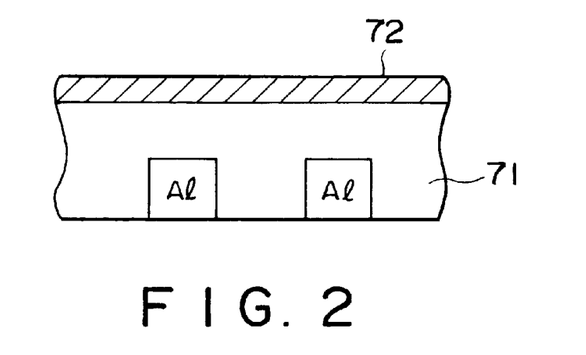
FIG. 2 is a sectional view showing an example of a film of a two-layer structure formed by the plasma treatment system of FIG. 1.

The enhanced thermal stability means that the draft of fluorine (F) is small even at a high temperature. In the two-layer film, the $SiO_2$ film is more tightly formed than the SiOF film, so that F dissociated from the SiOF film can not pass through the $SiO_2$ film. Thus, the draft of F is restricted, so that the thermal stability is enhanced. The thickness of the SiOF film is about 5000 angstrom, and the thickness of the $SiO_2$ film is about 300 angstrom.

In order to form such a two-layer film, the main electromagnetic coil 5 is first moved by the lifting shaft 52 so that the lower surface of the coil 5 is arranged at a lower position than the lower surface of the transmission window 23 by, e.g., 139 mm, and the auxiliary electromagnetic coil 6 is moved by the lifting shaft 63 so that the upper surface of the coil 6 is arranged at a lower position than the bottom surface of the thin film deposition chamber 22 by, e.g., 50 mm. On the other hand, a gate valve (not shown) provided on the side wall of the vacuum vessel 2 is open, and a wafer W, on which an aluminum wiring has been formed, is introduced from a load-lock chamber (not shown) by means of a transport arm (not shown) to be mounted on the mounting table 4.

Subsequently, after the gate valve is closed so that the interior is closed, the internal atmosphere is evacuated to a predetermined degree of vacuum. Then, plasma gases, e.g., Ar and $O_2$ gases, are introduced from the gas nozzles 31 into the plasma chamber 21 at predetermined flow rates, and a first thin film deposition gas, e.g., $SiF_4$ gas, is introduced from the thin film deposition gas supply position 32 into the thin film deposition chamber 22 at a predetermined flow rate. Then, the pressure in the vacuum vessel 2 is maintained at a process pressure of 0.25 Pa, and a bias voltage with 13.56 MHz and 2700 W is applied to the mounting table 4 by means of the high-frequency power supply 43. In addition, the surface temperature of the mounting table 4 is set to be 200° C.

On the other hand, a high frequency (microwave) M of 2.45 GHz and 2500 W is introduced from the high frequency power supply into the plasma chamber 21 via the waveguide 24 and the transmission window 23. In addition, the currents of the main electromagnetic coil 5 and the auxiliary electromagnetic coil 6 are set to be 200 A and 160 A, respectively, to apply a mirror field B. Thus, in the plasma chamber 21, the interaction between the magnetic field B and the microwave M induces E (electric field)×H (magnetic field) to cause electron cyclotron resonance to produce plasma. This resonance produces plasma of Ar gas to enhance the density thereof. Thus, the plasma is stabilized by Ar gas.

The produced plasma flows from the plasma chamber 21 into the thin film deposition chamber 22 as a plasma stream. The $SiF_4$ gas supplied to the thin film deposition chamber 22 is activated by the plasma stream to form active species (plasma). On the other hand, the plasma ions are drawn into the wafer W by the bias voltage to scrape off the corners of the pattern (recessed portion) on the surface of the wafer W to increase the frontage thereof. While this sputter etching is carried out, an SiOF film is deposited by the plasma of the thin film deposition gas to be embedded in the recessed portion. Thus, the interlayer insulator film 71 of SiOF film is formed.

Subsequently, the main electromagnetic coil 5 is further moved so that the lower surface of the coil 5 is positioned at a lower position than the lower surface of the transmission window 23 by, e.g., 157 mm. At this time, the upper surface of the auxiliary electromagnetic coil 6 remains being positioned at a lower position than the bottom surface of the thin film deposition chamber 22 by, e.g., 50 mm.

Then, plasma gases, e.g., Ar and $O_2$ gases, are introduced into the plasma chamber 21 at predetermined flow rates, and a second thin film deposition gas, e.g., $SiH_4$ gas, is introduced into the thin film deposition chamber 22 at a predetermined flow rate. Then, the pressure in the vacuum vessel 2 is maintained at a process pressure of, e.g., 0.25 Pa, and a bias voltage with 13.56 MHz and 2250 W is applied. In addition, the surface temperature of the mounting table 4 is set to be 200° C.

On the other hand, a high frequency M of 2.45 MHz and 2250 W is introduced into the plasma chamber 21, and the currents of the main electromagnetic coil 5 and the auxiliary electromagnetic coil 6 are set to be 200 A and 200 A, respectively, to apply a mirror field B to activate $SiH_4$ gas by the electron cyclotron resonance. Thus, a cap film 72 of $SiO_2$ film is formed on the surface of the interlayer insulator film 71 of SiOF film.

In such a plasma treatment system, the main electromagnetic coil 5 and the auxiliary electromagnetic coil 6 are provided so as to be movable vertically, and the position of the main electromagnetic coil 5 is changed in the processes for depositing the SiOF and $SiO_2$ films in the above described preferred embodiment, so that it is possible to enhance the inplane uniformity of thickness of the SiOF and $SiO_2$ films. It was measured that the inplane uniformity of thickness of the SiOF film was about 6%, and the inplane uniformity of thickness of the $SiO_2$ film was about 5%.

An example of experiment carried out to confirm the relationship between the inplane uniformity of thickness and the position of the electromagnetic coil will be described below. In this example, the plasma treatment system shown in FIG. 1 was used. In this system, Ar and $O_2$ gasses were introduced into the plasma chamber 21 at flow rates of 350 sccm and 200 sccm, respectively, and $SiF_4$ gas was supplied to the plasma chamber 21 at a flow rate of 140 sccm. In addition, a high frequency power of 2500 W, a bias power of 2700 W and a thin film deposition temperature of 200° C. were applied to deposit an SiOF film having a thickness of 5000 angstrom on the wafer on the same process conditions as those in the above described preferred embodiment.

In this case, while the upper surface of the auxiliary electromagnetic coil 6 was arranged at a lower position than the bottom surface of the thin film deposition chamber 22 by 25 mm, the main electromagnetic coil 5 was arranged at different positions to deposit thin films, and the deposition speed and the inplane uniformity of the obtained SiOF films were examined. The inplane uniformity was measured by the fully automatic spectral ellipsometric measuring method, and the calculation thereof was carried out by calculating the values of 3σ with respect to 49 points in plane.

In addition, Ar and $O_2$ gases were introduced into the plasma chamber 21 at flow rates of 200 sccm and 104 sccm, respectively, and $SiH_4$ was supplied thereto at a flow rate of 80 sccm. A high frequency power of 2250 W, a bias power of 2250 W and a thin film deposition temperature of 200° C. were applied to deposit an $SiO_2$ film having a thickness of 5000 angstrom on a wafer on the same process conditions as those in the above described preferred embodiment. Thus, the same experiment was carrried out.

Figure 3:
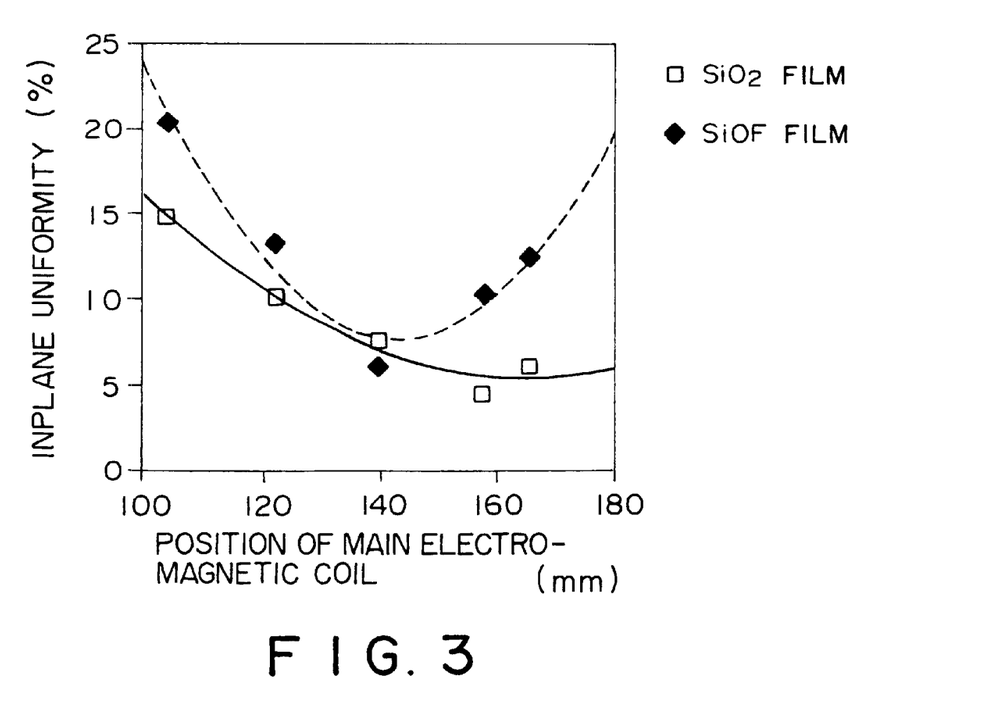
FIG. 3 is a characteristic diagram showing the relationship between the position of a main electromagnetic coil and the inplane uniformity of thickness.
Figure 4:
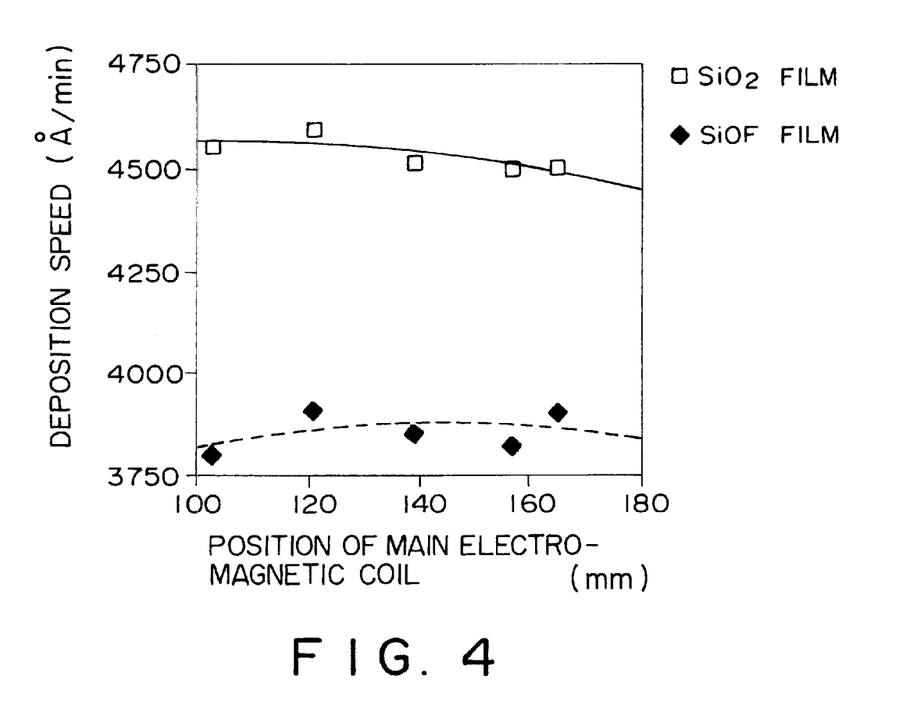
FIG. 4 is a characteristic diagram showing the relationship between the position of a main electromagnetic coil and the thin film deposition speed.

These results are shown in FIGS. 3 and 4. FIG. 3 shows the inplane uniformity of thickness of the SiOF and $SiO_2$ films by ◆ and ☐, respectively, and FIG. 4 shows the deposition speed thereof. In these drawings, the position of the main electromagnetic coil 5 on abscissa is shown by the distance between the lower surface of the coil 5 and the lower surface of the transmission window 23.

It was ascertained by these results that, by moving the main electromagnetic coil 5, the inplane uniformity of thickness of the SiOF film changed between 6% and 21% and the inplane uniformity of thickness of $SiO_2$ film changed between 5% and 15%. Thus, it was ascertained that there were coil positions at which the SiOF and $SiO_2$ films had the highest inplane uniformity of thickness, the coil positions being different in accordance with the kind of film.

It was ascertained that, for example, when the SiOF film was deposited, the optimum position of the main electromagnetic coil 5 was a position at which the lower surface of the coil 5 was arranged at a lower position than the lower surface of the transmission window 23 by 139 mm, and when the $SiO_2$ film was deposited, the optimum position of the main electromagnetic coil 5 was a position at which the lower surface of the coil 5 was arranged at a lower position than the lower surface of the transmission window 23 by 157 mm, so that the inplane uniformity of thickness of the respective films was enhanced to about 5 to 6% by arranging the coil 5 to the optimum positions in the respective processes. It was also ascertained that the deposition speed was not deteriorated even if the main electromagnetic coil 5 was arranged at the optimum position.

Figure 5A:
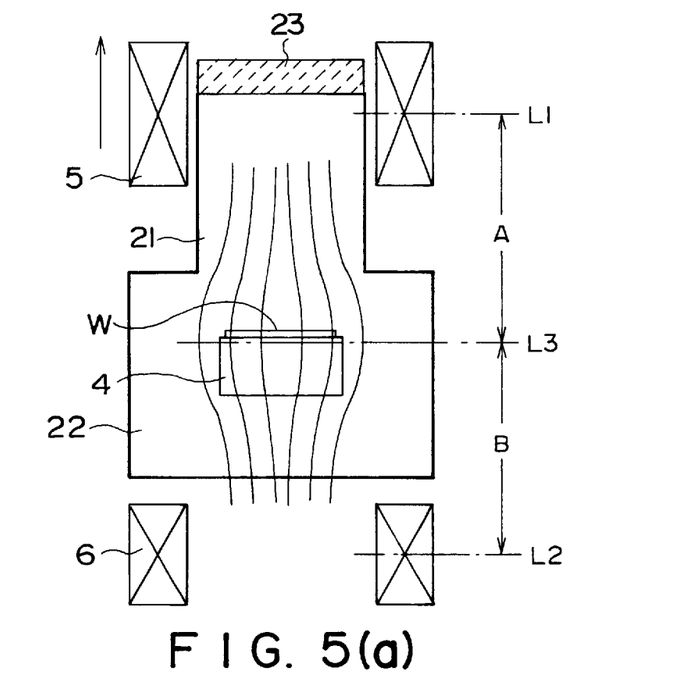
FIGS. 5(a) and 5(b) are sectional views showing the relationship between the position of a main electromagnetic coil and the shape of a magnetic field.
Figure 5B:
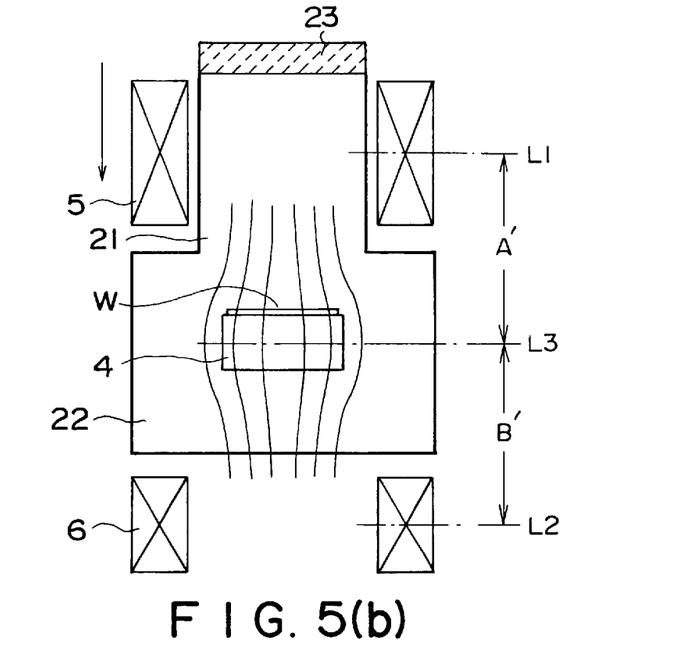

Thus, it is guessed that the reason why the optimum positions of the electromagnetic coil for enhancing the inplane uniformity of thickness exist is as follows. It is conceived that the shape of the applied magnetic field is different in the respective deposition process since the position of the main electromagnetic coil 5 is different in the respective deposition processes in the above described preferred embodiment. For example, when the position of the auxiliary electromagnetic coil 6 is fixed and the position of the main electromagnetic coil 5 is varied to form a mirror field as shown in FIG. 3, FIG. 5(a) shows the shape of the magnetic field when the main electromagnetic coil 5 is arranged at a higher position, and FIG. 5(b) shows the shape of the magnetic field when the main electromagnetic coil 5 is arranged at a lower position. Thus, it is conceived that the shape of the obtained magnetic field is changed in accordance with the position of the main electromagnetic coil 5.

These drawings will be briefly described. In these drawings, L1 denotes the central position of the main electromagnetic coil 5 in vertical directions, L2 denotes the central position of the auxiliary electromagnetic coil 6 in vertical directions, and L3 denotes a position at which the horizontal component of the magnetic field (the intensity of the magnetic field in horizontal directions) Br is substantially zero. In FIG. 5(a), the distance A between L1 and L3 is substantially equal to the distance B between L2 and L3, and in FIG. 5(a), the distance A⁻ between L1 and L3 is substantially equal to the distance B⁻ between L2 and L3. As can be clearly seen from these drawings, the position of L3 is positioned in vicinity of the upper surface of the mounting table 4 in the case of FIG. 5(a) in which the main electromagnetic coil 5 is positioned at a higher position, and the position of L3 is positioned in vicinity of the central portion of the mounting table 4 in the case of FIG. 5(b) in which the main electromagnetic coil 5 is positioned at a lower position, so that the position of L3 of the obtained magnetic field is lower than in the case of FIG. 5(a).

In the case of the SiOF film, SiOF gas serving as a thin film deposition gas is dissociated to an active species of $SiF_3$ ($SiF_3^*$) and an active species of F ($F^*$) as shown by the following formula (1). In the case of the $SiO_2$ film, $SiH_4$ gas serving as the thin film deposition gas is dissociated to an active species of $SiH_3$ ($SiH_3^*$) and an active species of H ($H^*$) as shown by the following formula (2).

$$SiF_4 \rightarrow SiF_3^* + F^* \quad (1)$$

$$SiH_4 \rightarrow SiH_3^* + H^* \quad (2)$$

Thus, although the active species obtained by activation is different in accordance with the kind of thin film deposition gas, the weight and life of the active species are different in accordance with the kind of the active species, so that it is conceived that, by this difference, the scattering way of the different active species is different even if the shape of the magnetic field is same. Therefore, it is guessed that there is the optimum shape to enhance the inplane uniformity of thickness in accordance with the kind of the thin film deposition gas.

Thus, in this preferred embodiment, the shape of the magnetic field is changed by moving the main electromagnetic coil 5, so that the degree of freedom for the shape of the obtained magnetic field is increased by combining the adjustment of the coil position with the adjustment of the coil current. Thus, the optimum shape of the magnetic field to enhance the inplane uniformity of thickness in the respective processes for depositing the SiOF and $SiO_2$ films can be obtained by the adjustment of the coil position and coil current, Therefore, if the coil position and coil current for obtaining the optimum shape of the magnetic field are previously determined by experiment, even if different kinds of films are continuously formed by means of the same plasma treatment system, it is possible to easily obtain films, each having a high inplane uniformity of thickness.

Subsequently, referring to FIGS. 6(a), 6(b) and 7, another preferred embodiment of the present invention will be described below. In this preferred embodiment, the present invention is applied to preheat. The term "preheat" means the pretreatment for the thin film deposition. For example, when a thin film deposition gas is introduced to carry out the thin film deposition immediately after a wafer W of ordinary temperature is mounted on the mounting table, although the wafer W is heated by plasma, the temperature thereof is not raised to a predetermined temperature which is set when the thin film deposition is carried out, so that the thin film deposition proceeds at a lower temperature than a predetermined temperature. Thus, a thin film having a bad quality is formed. In order to prevent this, the preheat is carried out. Specifically, after the wafer W is mounted on the mounting table, before the thin film deposition gas is introduced, plasma is produced, and the wafer W is heated to a predetermined temperature, e.g., a thin film deposition temperature, by the produced plasma.

A series of processes for forming an interlayer insulator film of a CF film on a wafer W by means of the above described plasma treatment system will be described below. First, the positions of the main electromagnetic coil 5 and the auxiliary electromagnetic coil 6 are set to, e.g., positions shown in FIG. 6(a) so as to obtain the shape of the magnetic field in which the lines of magnetic force are converged on the central portion of the wafer W.

Figure 6A:
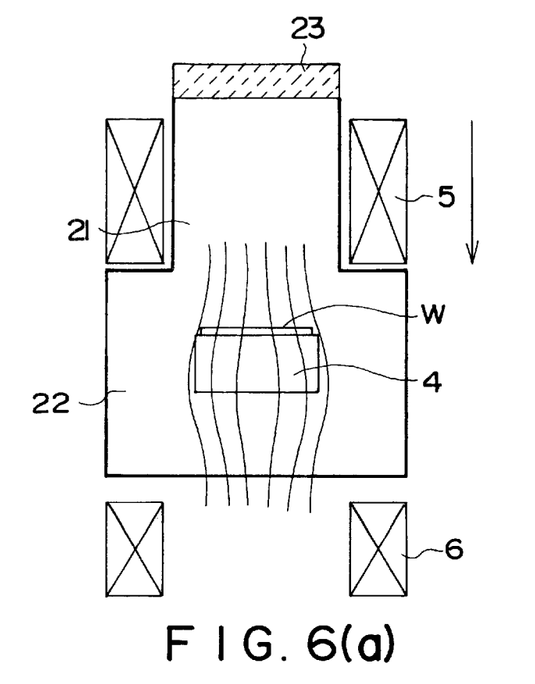
FIGS. 6(a) and 6(b) are sectional views showing the relationship between the position of a main electromagnetic coil and the shape of a magnetic field in another preferred embodiment according to the present invention.
Figure 6B:
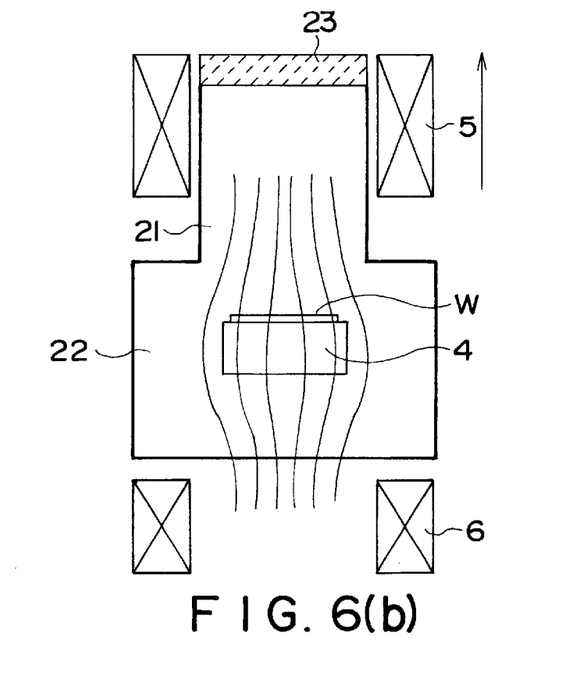
Figure 7:
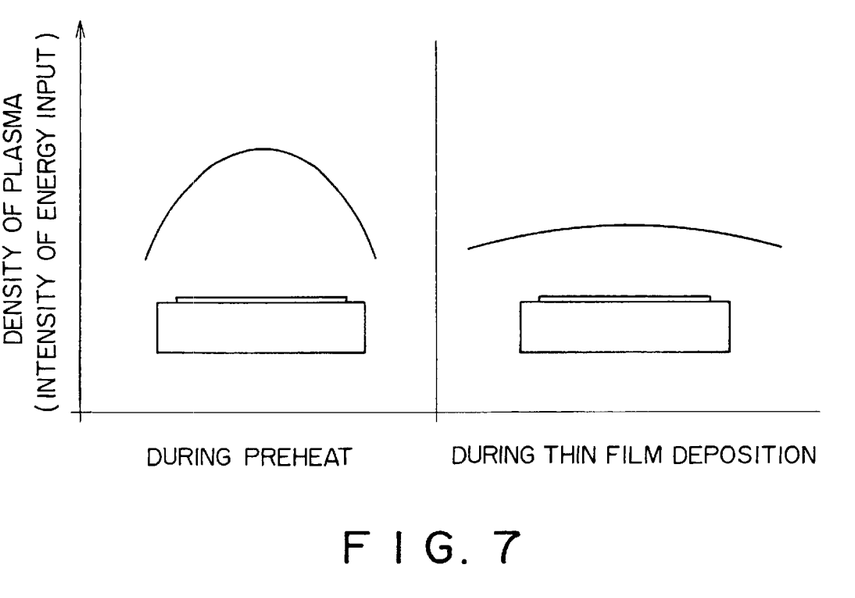
FIG. 7 is a schematic diagram for explaining the intensity of energy input.

Then, the wafer W is fed into the vacuum vessel 2 to be mounted on the mounting table 4 to carry out preheat serving as a first step (see FIG. 6(a)). That is, Ar gas is introduced into the first vacuum chamber 21 at a predetermined flow rate. In addition, under a predetermined process pressure, a microwave of 2.45 GHZ and 2.8 kW is applied from the high-frequency power supply (not shown), and a bias power of 13.56 MHz and 0 kW is applied to the mounting table 4 from the high-frequency power supply 43. The surface temperature of the mounting table 4 is set to be always, e.g., 80° C. Then, Ar gas is activated by the electron cyclotron resonance to produce plasma, by which the wafer W is heated. Until the temperature of the wafer W reaches about 400° C., the plasma is produced for about 20 seconds to carry out preheat.

Subsequently, the positions of the main electromagnetic coil 5 and the auxiliary electromagnetic coil 6 are set to, e.g., positions shown in FIG. 6(b) so as to obtain the shape of the magnetic field in which the outside magnetic field is widened in the plane of the wafer W so that the lines of magnetic force is substantially uniform in the plane of the wafer W. Thus, a CF film is deposited as a second step. In this case, for example, the position of the auxiliary electromagnetic coil 6 is not changed and the position of the main electromagnetic coil 5 is moved upwards to form the aforementioned shape of magnetic field.

The deposition of the CF film is carried out by introducing a plasma gas, e.g., Ar, and thin film deposition gases, e.g., $C_4F_8$ and $C_2H_4$ gases, into the vacuum vessel 2 at predetermined flow rates, respectively, and by applying a microwave of 2.45 GHz and 2.7 kW and a bias voltage of 13.56 MHz and 2.0 kW under a predetermined process pressure to activate the gases to produce plasma by the electron cyclotron resonance.

In such a preferred embodiment, since the position of the main electromagnetic coil 5 is changed between a position during the preheat and a position during the thin film deposition to produce plasma suitable for the respective treatments, it is possible to reduce the time required for the preheat. That is, during the preheat, the quantity of energy input into the wafer W is regarded as more important than the uniformity to form a magnetic field so as to increase the quantity of energy input, and during the thin film deposition, the uniformity is regarded as more important than the quantity of energy input to form a magnetic field having a high inplane uniformity.

The magnetic field is formed by the main electromagnetic coil 5 and the auxiliary electromagnetic coil 6. The magnetic field formed by the main electromagnetic coil 5 has a shape which is widened outside as extending downwards, and the magnetic field formed by the auxiliary electromagnetic coil 6 has a shape which is widened outside as extending upwards, so that the outside widened magnetic field formed by the main electromagnetic coil 5 is narrowed inside by the auxiliary electromagnetic coil 6. As a result, the magnetic field formed by the main electromagnetic coil 5 and the auxiliary electromagnetic coil 6 has a shape of a mirror field which is gradually expanded as extending downwards and gradually narrowed as further extending downwards. As described above, the plasma is produced by the interaction between electric and magnetic fields, and the shape thereof depends on the shape of the magnetic field.

In the above described example, the main electromagnetic coil 5 is moved downwards during the preheat, so that the position of the most expanded portion of the magnetic field is positioned below the surface of the wafer, and the magnetic field near the surface of the wafer is narrowed. In this case, the lines of magnetic force are converged in vicinity of the central portion of the wafer W, so that the magnetic flux density is great in vicinity of the central portion of the wafer W.

On the other hand, during the thin film deposition, the position of the main electromagnetic coil 5 is moved to a higher position than that during the preheat, so that the surface of the wafer is positioned in vicinity of the most expanded portion of the magnetic field. Therefore, the outside magnetic field is extended in vicinity of the surface of the wafer to some extent. In this case, although the lines of magnetic force are substantially uniform in the inplane of the wafer W, the magnetic flux density is decreased.

The density of plasma produced herein (the intensity of energy input into the wafer W) is in proportional to the magnetic flux density. Therefore, as shown in FIG. 7, during the thin film deposition, although the density of plasma is substantially uniform in the inplane of the wafer W, the total quantity of energy input is decreased. On the other hand, during the preheat, although the intensity of energy input of the produced plasma is ununiform in the inplane of the wafer W, the total quantity is far greater than that during the thin film deposition.

Thus, in this method, the positions of the main electromagnetic coil 5 and the auxiliary electromagnetic coil 6 are controlled to form a magnetic field having a greater quantity of energy input of the wafer W during the preheat and to form a magnetic field having a high inplane uniformity during the thin film deposition. Therefore, for example, after the wafer W of ordinary temperature is introduced into the vacuum vessel 2, the wafer W is mounted on and vacuum held to the mounting table 4. At this time, the time (preheat time) required for the wafer W, the temperature of which has been raised to about 80° C., to be heated to about 400° C. serving as a thin film deposition temperature may be 20 seconds.

Conventionally, the preheat and thin film deposition are carried out by producing plasma which is considered being most suitable for the thin film deposition. In this case, the time required for the temperature of a wafer W being 80° C. to be raised to 400° C. serving as the thin film deposition temperature is about 60 seconds. Therefore, in this preferred embodiment, the preheat time can be remarkably reduced in comparison with the conventional method, so that it is possible to improve the total throughput.

In addition, in the above described example, while the bias power has been 0 kW in order to decrease damage to a device in an ununiform specification, a fine bias power of about 300 W may be applied to carry out a higher speed preheat during the thin film deposition for a device, to which damage is small. In this case, the preheat time can be further reduced.

Figure 8A:
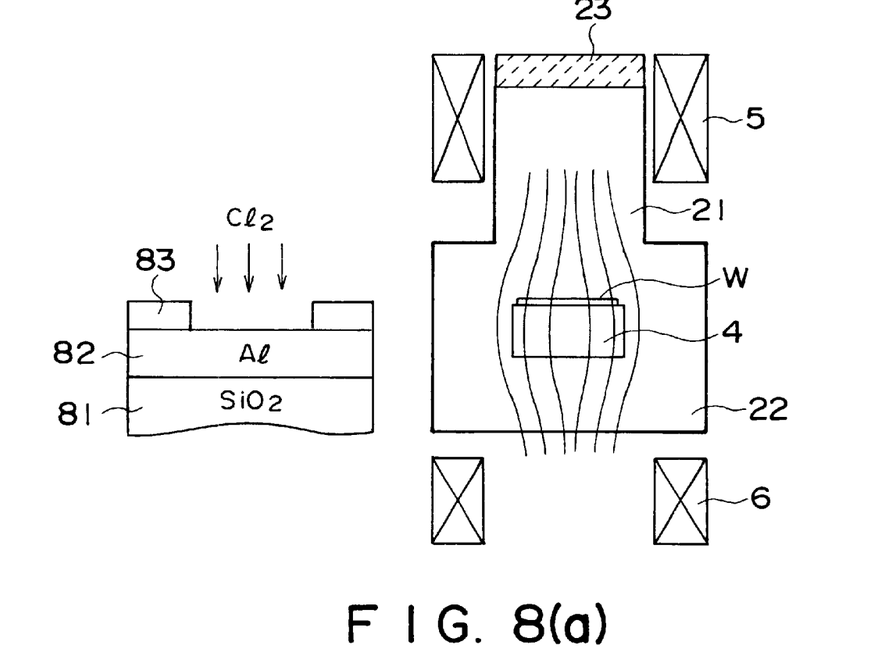
FIGS. 8(a) and 8(b) are sectional views of another preferred embodiment according to the present invention.
Figure 8B:
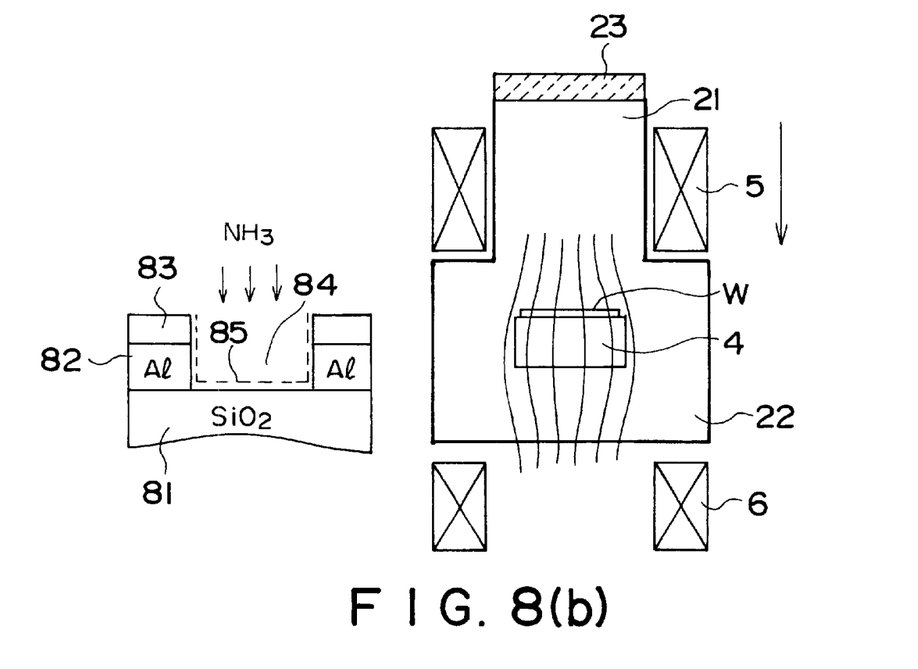

Referring to FIG. 8, another preferred embodiment of the present invention will be described below. In this preferred embodiment, the present invention is applied to etching. An example of etching in this preferred embodiment will be described. An aluminum (Al) layer 82 is formed on the upper surface of a substrate 81 of, e.g., $SiO_2$ film, and a pattern of a resist film 83 is formed on the upper surface of the Al layer 82 to etch the Al layer 82 with an etching gas, e.g., $Cl_2$ gas.

Specifically, such etching will be described. First, as shown in FIG. 8(*a*), a step of etching the Al layer 82 with $Cl_2$ gas is carried out by means of the above described plasma treatment system. That is, e.g., the positions of the main electromagnetic coil 5 and the auxiliary electromagnetic coil 6 are set to be, e.g., positions shown in FIG. 8(*a*) so as to obtain the shape of a magnetic field in which the lines of magnetic force are substantially uniform in the plane of the wafer W.

Then, plasma gases, e.g., Ar and $Cl_2$ gases, are introduced at predetermined flow rates, respectively, and a bias voltage of 13.56 MHz and a microwave of 2.45 GHz are introduced under a predetermined process pressure. Then, $Cl_2$ gas is activated to produce plasma by the electron cyclotron resonance at a process pressure of 0.5 Pa to etch the Al layer 82 with the produced plasma. That is, while plasma ions are drawn into the Al layer 82 by the bias voltage, the corners of pattern on the surface are scraped off to extend the frontage thereof to carry out the sputter etching.

Thereafter, the positions of the main electromagnetic coil 5 and the auxiliary electromagnetic coil 6 are set to be, e.g., positions shown in FIG. 8(*b*), so as to obtain the shape of a magnetic field in which the lines of magnetic force are converged on the central portion of the wafer W. That is, for example, the position of the main electromagnetic coil 5 is moved downwards without moving the auxiliary electromagnetic coil 6. Then, a post-treatment step of removing the residual 85 of $Cl_2$ gas, which remains in a groove 84 formed by etching, with a post-treatment gas is carried out. That is, a plasma gas, e.g., Ar gas, and a post-treatment gas, e.g., $NH_3$ gas, are introduced at predetermined flow rates, respectively, and the $NH_3$ gas is activated to produce plasma by the electron cyclotron resonance at a process pressure of 133 Pa to reduce and thermally evaporate Cl being the residual 85 to remove Cl.

In such a preferred embodiment, the shape of the magnetic field is change by changing the positions of the main electromagnetic coil 5 and the auxiliary magnetic coil 6 between the positions during the etching of the Al layer 82 and the positions during the post-treatment, so that plasma suitable for the respective treatments are produced. Therefore, it is possible to uniformly carry out etching, and it is possible to reduce the time required for the post-treatment.

That is, during the etching, the magnetic field is a mirror field in which the lines of magnetic force are substantially uniform in the plane of the substrate 81 as shown in FIG. 8(*a*) as described in the above described preferred embodiment. In such a magnetic field, the density of plasma is substantially uniform in the plane of the substrate 81, so that it is possible to uniformly carry out etching.

On the other hand, during the post-treatment, the position of the main electromagnetic coil 5 is positioned at a lower position than that during the etching, so that the magnetic field is a mirror field in which the lines of magnetic force are converged on a portion in vicinity of the central portion of the substrate 81 shown in FIG. 8(*b*) as described in the above preferred embodiment. In such a magnetic field, the density of plasma is far greater than that during the etching. However, when the density of plasma is increased, the quantity of active species is increased, so that the treatment for removing the residual easily proceeds. Thus, it is possible to reduce the time required for the post-treatment.

Figure 9A:
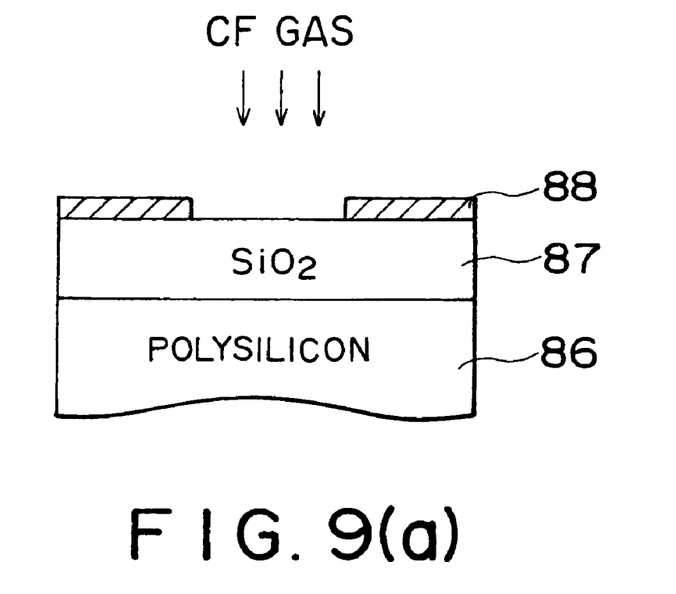
FIGS. 9(a) and 9(b) are sectional views of another preferred embodiment according to the present invention.
Figure 9B:
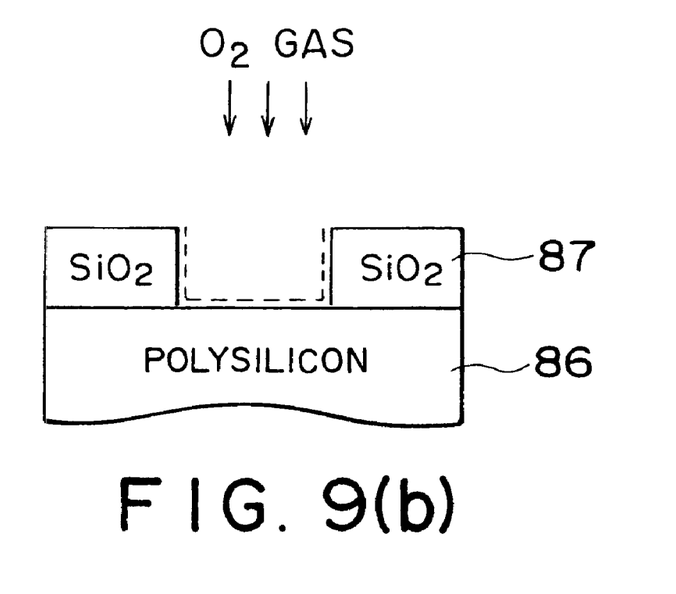

Referring to FIGS. 9(*a*) and 9(*b*), another example of the present invention applied to etching will be described below. An example of etching in his preferred embodiment will be described. For example, an $SiO_2$ film 87 is formed on the upper surface of a substrate 86 of, e.g., a polysilicon, and a resist film 88 is formed on the upper surface of the $SiO_2$ film 87. Then, the $SiO_2$ film 87 is etched with an etching gas, e.g., a compound gas of C (carbon) and F (fluorine), such as $C_4F_8$ gas, (which will be hereinafter referred to as a "CF gas").

Such etching will be specifically described. First, as shown in FIG. 9(*a*), a step of etching the $SiO_2$ film 87 with a CF gas is carried out by means of the above described plasma treatment system. That is, the positions of the main electromagnetic coil 5 and the auxiliary electromagnetic coil 6 are set so as to be able to obtain the shape of a magnetic field in which the lines of magnetic force are substantially uniform in the plane of the wafer W. Then, a plasma gas, e.g., Ar gas, and a CF gas are introduced at predetermined flow rates, respectively. In addition, a bias voltage of 13.56 MHz and a microwave of 2.45 GHz are introduced at a process pressure of 0.8 Pa to activate the CF gas to produce plasma by the electron cyclotron resonance to each the $SiO_2$ film with the produced plasma. Thereafter, as shown in FIG. 9(*b*), a post-treatment step of asking the resist film 88 with $O_2$ gas is carried out. That is, the positions of the main electromagnetic coil 5 and the auxiliary electromagnetic coil 6 are set so as to obtain the shape of a magnetic field in which the lines of magnetic force is converged at the center of the wafer W. Then, a plasma gas, e.g., Ar gas, and $O_2$ gas serving as a post-treatment gas are introduced at predetermined flow rates to activate the $O_2$ gas to produce plasma at a process pressure of 1.5 Pa by the electron cyclotron resonance, and the resist film 88 is removed by the produced plasma as $H_2O$ and $CO_2$.

In such a preferred embodiment, a magnetic field having lines of magnetic force, which are substantially uniform in the plane of the substrate 86, is formed during the etching, and a magnetic field having lines of magnetic force, which are converged in vicinity of the central portion of the substrate 86, is formed during the ashing. Therefore, during the etching, substantially uniform plasma is produced in the plane of the substrate 86, so that it is possible to achieve uniform etching. On the other hand, during the ashing, the density of plasma can be greater than that during the etching, so that the ashing time can be reduced.

Moreover, when, e.g., a polysilicon film is formed on the surface of a wafer W, on which, e.g., a p-type or n-type silicon film is formed, the present invention can be applied to a process for etching a natural oxide film formed on the wafer W and then forming the polysilicon film. In this case, a magnetic field, in which the lines of magnetic force are converged into vicinity of the central position, is first formed to etch the natural oxide film, which is formed on the surface of the silicon film, with, e.g., a CF gas, and then, a mirror field capable of obtaining a uniform density of plasma on the surface of the wafer W is formed to carry out the treatment. Also in this case, the pretreatment, which is a treatment for removing the natural oxide film, can be carried out for a short time.

Figure 10:
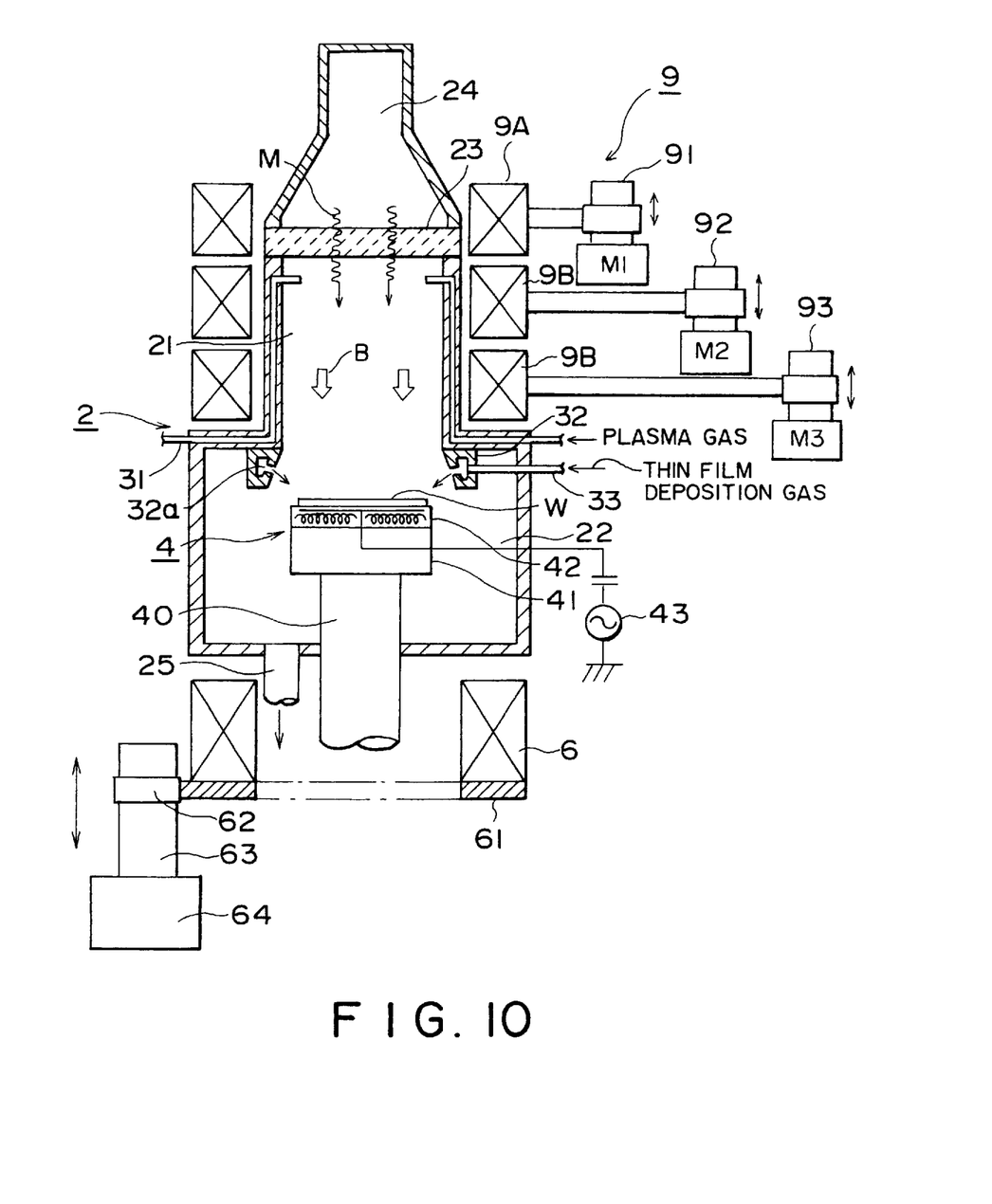
FIG. 10 is a longitudinal section of another preferred embodiment of a plasma treatment system according to the present invention.

In the plasma treatment system for carrying out the method of the present invention, a main electromagnetic coil 9 as shown in, e.g., FIG. 10, may be used. This main electromagnetic coil 9 is divided into, e.g., three electromagnetic coils 9A, 9B and 9C, which are movable vertically by motor drive parts M1, M2 and M3 via lifting shafts 91, 92 and 93. Other constructions are the same as those of the plasma treatment system shown in FIG. 1.

To change the magnetic field as described above is to control the plasma treatment for the substrate by changing the profile of the magnetic field during the treatment. The change of the profile of the magnetic field during the treatment allows the control for converging the magnetic field at the center and diffusing the magnetic field to the periphery with respect to the treatment results in the plane of the substrate.

According to the present invention, a permanent magnet or the like may be used as a magnetic field forming means in place of the electromagnetic coil. As the first and second films, e.g., an SiOF film, an $SiO_2$ film based on the CVD, and so forth may be stacked, or a fluorine containing carbon, an SiN film and so forth may be stacked. Moreover, in the etching of the Al layer 82, plasma may be produced without adding $NH_3$ gas, and other treatments may be carried out by the produced plasma. Also in this case, the positions of the main electromagnetic coil 5 and the auxiliary electromagnetic coil 6 may be adjusted so as to increase the quantity of energy input of plasma into the substrate.

According to the present invention, in the adjustment of the magnetic field forming means, the position of the first magnetic field forming means may be fixed, and the position of the second magnetic field forming means may be changed. Alternatively, both of the first and second magnetic field forming means may be changed.

Moreover, the present invention should not be limited to the application to the production of plasma by the ECR. For example, the present invention may be applied when plasma is produced by a method called ICP (Inductive Coupled Plasma), i.e., a method for supplying an electric field and a magnetic field to a treatment gas from a coil wound onto a dome-shaped vessel. Moreover, the present invention may be applied when plasma is produced by the interaction between a helicon wave of, e.g., 13.56 MHz, which is called helicon liquid plasma, and a magnetic field applied by a magnetic coil, or when plasma is produced by applying a magnetic field which is substantially parallel to two parallel cathodes, which is called magnetron plasma, or when plasma is produced by applying a high-frequency power between facing electrodes called parallel plates.

What is claimed is:

1. A plasma treatment method for supplying a microwave into a vacuum vessel by high-frequency producing means and for forming a magnetic field in said vacuum vessel by magnetic field forming means, to produce plasma in said vacuum vessel by the electron cyclotron resonance between said microwave and said magnetic field to treat a substrate with the produced plasma, said plasma treatment method comprising:

a first step of introducing said substrate into said vacuum vessel and producing plasma to preheat said substrate before forming a thin film on said substrate; and a second step of activating a thin film deposition gas to produce plasma in said vacuum vessel and forming said thin film on said substrate with the produced plasma, wherein the position of said magnetic field forming means is changed between positions in said first and second steps to change the shape of said magnetic field so that magnetic lines of force of said field converge on a central portion of said substrate during said first step to a greater extent than during said second step, and lines of force of said field are substantially more uniform over the plane of said substrate during said second step than during said first step.

2. A plasma treatment method for supplying a microwave into a vacuum vessel by high-frequency producing means and for forming a magnetic field in said vacuum vessel by magnetic field forming means, to produce plasma in said vacuum vessel by the electron cyclotron resonance between said microwave and said magnetic field to treat a substrate with the produced plasma, said plasma treatment method comprising:

a first step of introducing said substrate into said vacuum vessel and producing plasma to preheat said substrate before forming a thin film on said substrate; and a second step of activating a thin film deposition gas to produce plasma in said vacuum vessel to form a thin film on said substrate with the produced plasma, wherein the current flowing through an electromagnetic coil of said magnetic field forming means is changed between currents in said first and second steps to change the shape of said magnetic field so that magnetic lines of force of said field converge on a central portion of said substrate during said first step to a greater extent than during said second step, and lines of force of said field are substantially more uniform over the plane of said substrate during said second step than during said first step.

* * * * *